United States Patent
Jang et al.

(10) Patent No.: US 11,171,667 B2
(45) Date of Patent: Nov. 9, 2021

(54) APPARATUS AND METHOD FOR DECODING OF LOW-DENSITY PARITY CHECK CODES IN WIRELESS COMMUNICATION SYSTEM

(71) Applicant: Samsung Electronics Co., Ltd., Suwon-si (KR)

(72) Inventors: Min Jang, Suwon-si (KR); Hyuntack Lim, Suwon-si (KR); Hongsil Jeong, Suwon-si (KR); Hayoung Yang, Suwon-si (KR); Joohyun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/855,524

(22) Filed: Apr. 22, 2020

(65) Prior Publication Data

US 2020/0350927 A1 Nov. 5, 2020

(30) Foreign Application Priority Data

May 3, 2019 (KR) .......................... 10-2019-0052566

(51) Int. Cl.
*H03M 13/00* (2006.01)
*H03M 13/11* (2006.01)

(52) U.S. Cl.
CPC ..... *H03M 13/1128* (2013.01); *H03M 13/616* (2013.01)

(58) Field of Classification Search
CPC .................. H03M 13/1128; H03M 13/616
See application file for complete search history.

(56) References Cited

U.S. PATENT DOCUMENTS

| 8,190,962 | B1* | 5/2012 | Chen ................... H03M 13/658 |
| | | | 714/752 |
| 9,048,871 | B2 | 6/2015 | Varnica et al. |
| 2008/0155372 | A1 | 6/2008 | Kravitz et al. |
| 2014/0372825 | A1 | 12/2014 | Jeong et al. |
| 2015/0333774 | A1 | 11/2015 | Kaynak et al. |
| 2017/0070239 | A1* | 3/2017 | Hung ................. H03M 13/1185 |
| 2017/0288812 | A1 | 10/2017 | Myung et al. |
| 2018/0102791 | A1* | 4/2018 | Zhang ................... H04B 10/27 |
| 2018/0262211 | A1 | 9/2018 | Savin et al. |

OTHER PUBLICATIONS

International Search Report dated Aug. 6, 2020, issued in International Application No. PCT/KR2020/005288.

* cited by examiner

*Primary Examiner* — Samir W Rizk
(74) *Attorney, Agent, or Firm* — Jefferson IP Law, LLP

(57) ABSTRACT

The present disclosure relates to a pre-$5^{th}$-Generation (5G) or 5G communication system to be provided for supporting higher data rates beyond $4^{th}$-Generation (4G) communication system, such as long-term evolution (LTE). The disclosure provides decoding of a low-density parity-check (LDPC) code in a wireless communication system, and a decoding method of the LDPC code may include receiving a codeword, performing decoding iterations on the codeword a predefined maximum number of times using a parity check matrix, performing partial decoding using a partial area of the parity check matrix, and determining decoding success or failure of the codeword based a result of the partial decoding.

14 Claims, 11 Drawing Sheets

$$H = \begin{bmatrix} 1 & 1 & 1 & 1 & 0 & 1 & 1 & 0 & 0 & 0 \\ 0 & 0 & 1 & \boxed{1} & 1 & 1 & 1 & 1 & 0 & 0 \\ 0 & 1 & 0 & 1 & 0 & 1 & 0 & 1 & 1 & 1 \\ 1 & 0 & 1 & 0 & 1 & 0 & 0 & 1 & 1 & 1 \\ 1 & 1 & 0 & 0 & 1 & 0 & 1 & 0 & 1 & 1 \end{bmatrix}$$

with column labels $v_0, v_1, v_2, v_3, v_4, v_5, v_6, v_7, v_8, v_9$ and row labels $c_0, c_1, c_2, c_3, c_4$.

APPARATUS AND METHOD FOR DECODING OF LOW-DENSITY PARITY CHECK CODES IN WIRELESS COMMUNICATION SYSTEM

CROSS-REFERENCE TO RELATED APPLICATION(S)

This application is based on and claims priority under 35 U.S.C. § 119(a) of a Korean patent application number 10-2019-0052566, filed on May 3, 2019, in the Korean Intellectual Property Office, the disclosure of which is incorporated by reference herein in its entirety.

BACKGROUND

1. Field

The disclosure relates to a wireless communication system. More particularly, the disclosure relates to an apparatus and a method for decoding low-density parity-check (LDPC) codes in the wireless communication system.

2. Description of Related Art

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'beyond 4G network' or a 'post long term evolution (LTE) System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In general, if data is transmitted and received between a transmitter and a receiver in communication and broadcasting systems, data error may occur due to noise in a communication channel Coding schemes designed to correct the error caused by the communication channel at the receiver include error detecting codes and error correcting codes (ECC) schemes. More particularly, the ECC used for the communication between the transmitter and the receiver may be generally referred to as channel coding. In the ECC, the transmitter transmits data by adding a redundant bit to a data bit to transmit, and the receiver decodes to correct an error in the data bit using the redundant bit.

In the communication and broadcasting systems, various channel coding schemes, such as convolutional coding, turbo coding, low-density parity-check (LDPC) coding, and polar coding are used. The LDPC coding of those channel coding schemes exhibits higher error correcting performance than the other channel coding schemes, as a length of the code increases. In addition, since a coding structure of the LDPC code and its belief-propagation (BP) decoding are suitable for parallelization, the LDPC code is suitable for an application system requiring high throughput. Thus, the LDPC code is used in various communication and broadcasting systems, such as institute of electrical and electronical engineers (IEEE) 802.11n/ad Wi-Fi, digital video broadcasting (DVB)-T2/C2/S2, advanced television systems committee (ATSC) 3.0. More particularly, 3rd generation partnership project (3GPP) new radio (NR) which is the latest representative 5G mobile communication system agrees to use the LDPC code to transmit a signal over the data channel.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an apparatus and a method for efficiently decoding a low-density parity-check (LDPC) code in a wireless communication system.

Another aspect of the disclosure is to provide an apparatus and a method for efficiently performing syndrome-check which determines whether the decoding is success or failure while or after decoding the LDPC code using layered scheduling or its equivalent scheme.

Additional aspects will be set forth in part in the description which follows and, in part, will be apparent from the description, or may be learned by practice of the presented embodiments.

In accordance with an aspect of the disclosure, a method for decoding a LDPC code in a wireless communication system is provided. The method includes receiving a codeword, performing decoding iterations on the codeword a predefined maximum number of times using a parity check matrix, performing partial decoding using a partial area of the parity check matrix, and determining decoding success or failure of the codeword based a result of the partial decoding.

In accordance with another aspect of the disclosure, a method for decoding a LDPC code in a wireless communication system is provided. The method includes receiving a codeword, decoding the codeword using a parity check matrix, generating a first codeword by reencoding values corresponding to a message bit vector among values acquired through the decoding, generating a second codeword by hard-deciding the values acquired through the decoding, and determining decoding success or failure of the codeword based on a comparison result of the first codeword and the second codeword.

In accordance with another aspect of the disclosure, an apparatus for using a LDPC code in a wireless communication system is provided. The apparatus includes a transceiver and at least one processor connected to the transceiver. The at least one processor is configured to receive a codeword, perform decoding iterations on the codeword a predefined maximum number of times using a parity check matrix, perform partial decoding using a partial area of the parity check matrix, and determine decoding success or failure of the codeword based a result of the partial decoding.

In accordance with another aspect of the disclosure, an apparatus for using a LDPC code in a wireless communication system is provided. The apparatus includes a transceiver and at least one processor connected to the transceiver. The at least one processor is configured to receive a codeword, decode the codeword using a parity check matrix, generate a first codeword by reencoding values corresponding to a message bit vector among values acquired through the decoding, generate a second codeword by hard-deciding the values acquired through the decoding, and determine decoding success or failure of the codeword based on a comparison result of the first codeword and the second codeword.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 3A illustrates a parity-check matrix for a low-density parity-check (LDPC) code in a wireless communication system according to an embodiment of the disclosure;

FIG. 5B illustrates a submatrix of a parity-check matrix of an LDPC code in a wireless communication system according to an embodiment of the disclosure;

Throughout the drawings, like reference numerals will be understood to refer to like parts, components and structures.

DETAILED DESCRIPTION

Figure 1:
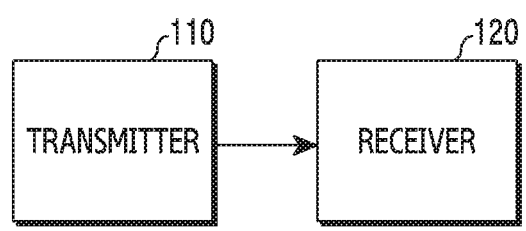
FIG. 1 illustrates a wireless communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Terms used in the disclosure are used for describing particular embodiments and are not intended to limit the disclosure. Further, unless defined otherwise, all the terms used herein, including technical and scientific terms, may have the same meanings as those generally understood by a person skilled in the art to which the disclosure pertains. Among terms used in the disclosure, the terms defined in a general dictionary may be interpreted to have the same or similar meanings with the context of the relevant art, and, unless explicitly defined in this disclosure, it shall not be interpreted ideally or excessively as formal meanings. In some cases, even if terms are defined in this disclosure, the terms should not be interpreted to exclude the embodiments.

In various embodiments to be described below, a hardware approach may be described as an example. However, it is understood that various embodiments may include a technology using both hardware and software, and various embodiments do not exclude a software-based approach.

Various embodiments provide an apparatus and a method for decoding a low-density parity-check (LDPC) code in a wireless communication system. More specifically, the disclosure describes a technique for determining whether the decoding is successful, if the LDPC code is decoded using layered scheduling or its equivalent scheme in the wireless communication system.

Terms indicating signals, terms indicating channels, terms indicating control information, terms indicating network entities, and terms indicating components of a device, which are used in the following descriptions, are for the sake of explanations. Accordingly, the disclosure is not limited to the terms to be described, and may use other terms having technically identical or similar meaning.

In this disclosure, to determine whether a specific condition is satisfied or fulfilled, expressions, such as "greater than" or "less than" are used by way of example and expressions, such as "greater than or equal to" or "less than or equal to" are also applicable and not excluded. For example, a condition defined with "greater than or equal to" may be replaced by "greater than" (or vice-versa), and a condition defined with "less than or equal to" may be replaced by "less than" (or vice-versa), and the like.

FIG. 1 illustrates a wireless communication system according to an embodiment of the disclosure.

Referring to FIG. 1, a transmitter 110 and a receiver 120, as part of devices or nodes using a radio channel in the wireless communication system is illustrated. While FIG. 1 depicts one transmitter 110 and one receiver 120, a plurality of transmitters and a plurality of receivers may be included. While the transmitter 110 and the receiver 120 are the separate entities in the disclosure to ease the understanding, functions of the transmitter 110 and the receiver 120 may be exchanged. For example, in an uplink of a cellular communication system, the transmitter 110 may be a terminal and the receive 120 may be a base station. In a downlink, the transmitter 110 may be a base station and the receive 120 may be a terminal.

In various embodiments of the disclosure, the transmitter 110 may generate a codeword by encoding information bits based on an LDPC code, and the receiver 120 may decode the received codeword based on the LDPC code. For example, the receiver 120 may use a layered scheduling scheme, and may perform syndrome-check. The transmitter 110 and the receiver 120 may perform the LDPC encoding and decoding using their identified parity-check matrix. For example, the parity-check matrix may include a parity-check matrix defined in $5^{th}$ generation (5G) new radio (NR) standard.

Figure 2:
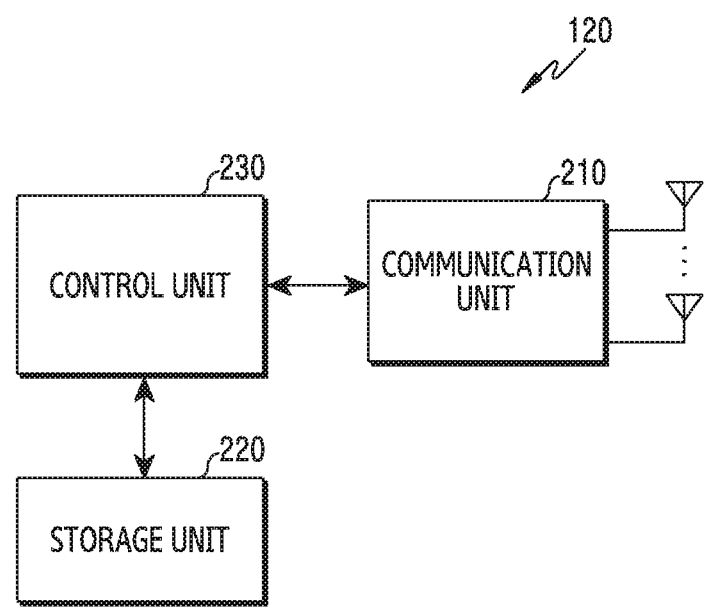
FIG. 2 illustrates a communication device in a wireless communication system according to an embodiment of the disclosure.

FIG. 2 illustrates a communication device in a wireless communication system according to an embodiment of the disclosure. For example, the configuration of FIG. 2 may be understood as the configuration of the receiver 120. In the following description, it is understood that a term, such as "unit" or "-er" indicates a unit for processing at least one function or operation, and may be implemented using hardware, software, or a combination of hardware and software.

Referring to FIG. 2, the device may include a wireless communication unit 210, a storage unit 220, and a control unit 230.

The communication unit 210 may transmit and receive signals over a radio channel For example, the communication unit 210 may perform a conversion function between a baseband signal and a bit string according to a physical layer standard of the system. For example, if data is transmitted, the communication unit 210 may generate complex symbols by encoding and modulating a transmit bit string. If data is received, the communication unit 210 may restore a receive bit string by demodulating and decoding a baseband signal. Furthermore, the communication unit 210 may up-convert the baseband signal to a radio frequency (RF) band signal, transmit the RF band signal via an antenna, and down-convert an RF band signal received via an antenna to a baseband signal.

For doing so, the communication unit 210 may include a transmit filter, a receive filter, an amplifier, a mixer, an oscillator, a digital to analog convertor (DAC), an analog to digital convertor (ADC), and the like. In addition, the communication unit 210 may include a plurality of transmission and reception paths. Further, the communication unit 210 may include at least one antenna array including a plurality of antenna elements. In terms of hardware, the communication unit 210 may include a digital unit and an analog unit, and the analog unit may include a plurality of sub-units according to an operating power and an operating frequency. The communication unit 210 may include a decoding unit for performing the decoding according to various embodiments of the disclosure.

As described above, the communication unit 210 transmits and receives signals. Hence, the communication unit 210 may be referred to as a transmitter, a receiver, or a transceiver. Hereinafter, the transmission and the reception over the radio channel may include the above-described processing of the communication unit 210. If the device of FIG. 2 is a base station, the communication unit 210 may further include a backhaul communication unit for communicating with other network entity connected over a backhaul network.

The storage unit 220 may store data, such as a basic program, an application program, configuration information, for operating the receiver 120. The storage unit 220 may include a volatile memory, a non-volatile memory, or a combination of a volatile memory and a non-volatile memory. The storage unit 220 may provide the stored data at a request from the control unit 230.

The control unit 230 controls general operations of the device. For example, the control unit 230 may transmit and receive signals through the communication unit 210. In addition, the control unit 230 may record data to the storage unit 220 and reads data from the storage unit 220. The control unit 230 may include at least one processor or a microprocessor, or may be a part of the processor. According to various embodiments of the disclosure, the control unit 230 may control the device to execute the following operations according to various embodiments.

The decoding of the LDPC code implemented in the layered scheduling scheme divides the whole parity-check matrix into a plurality of layers, and a computing device (e.g., a processor, a memory, a buffer, and the like) sequentially decodes the layers. The layered scheduling scheme may reduce a size of the computing device required for the decoding, and thus is utilized variously to realize an LDPC code decoder. The decoding of each layer is referred to as layer processing, and the layer processing on all the layers is referred to as iteration decoding. The decoding of the LDPC code includes repeating the iteration decoding for a designated number of times, and the number of the decoding iterations ranges from several times to tens or hundreds of times.

The syndrome-check for identifying whether the decoding is success or failure is conducted between the decoding iterations. The syndrome-check determines whether the decoding is successful, based on characteristics of the LDPC code, rather than a cyclic redundancy check (CRC) bit. Hence, the syndrome-check may be referred to as non-CRC error check, LDPC error check, or other term having the technically identical meaning The syndrome-check identifies whether all linear constraints in whole or a designated part of the parity-check matrix are satisfied. For example, through the syndrome-check, a corresponding bit estimation value is obtained by hard-deciding an updated log likelihood ratio (LLR) value of each variable node, and whether relevant bit estimation values satisfy all the linear constrains defined by each check node is identified. The syndrome-check success is declared if all the linear constrains are satisfied, and the syndrome-check failure is declared if at least one linear constrain is not satisfied. If the successful decoding is determined through the above-stated syndrome-check, a result up to a corresponding time may be outputted and the decoding may be finished. The syndrome-check is important in that it reduces meaningless computation and efficiently achieves the decoding, by early terminating the decoding. In addition, the result of the syndrome-check, which may be used as an error detection result of the LDPC code, improves overall reliability of the system.

Each layer processing is performed through variable node (VN) operation and check node (CN) operation. The syndrome-check may be conducted after one iteration decoding, or may be conducted as part of each layer processing. The syndrome-check is performed as part of each layer processing because the syndrome-check operation and the CN operation have many common portions and it is easy to design the two operations together. In a system, such as a 5G system requiring high throughput, requirements for power consumption and delay in the decoding are strict. Hence, efficiency is required in the implementation for the decoding, and thus the syndrome-check may be included in the layer processing. Various embodiments of the disclosure consider such a system.

If the syndrome-check may be included in each layer processing, a probability of miscalculating the syndrome-check result may increase. The layered scheduling sequentially decodes the layers. For example, the LLR values of the VN are updated in real time by each layer processing in one iteration decoding. Accordingly, the syndrome-check result obtained from the previous layered processing, that is, the layer-based CN operation, VN operation, LLR hard decision, and syndrome-check, may be changed by the LLR value update of the VN after other layer processing. For example, if the syndrome-check result in an i-th layer of one iteration decoding is stored, the LLR value of the VN related to the i-th layer may be updated in next layer processing. Thus, the syndrome-check of the i-th layer may substantially change. However, the decoder may not recognize this fact unless it reperforms the syndrome-check on the i-th layer. If the layer-based syndrome-check is conducted in this manner, it is difficult to implement a high-reliability system because it is hard to trust the syndrome-check result.

To address such problems, stability of the LDPC code decoding may be identified by using the syndrome-check result of two consecutive decoding iterations. Specifically, in the two consecutive decoding iteration s, the reliability of the syndrome-check may be improved by declaring the syndrome-check pass only if all or a predesignated part of the linear constraints of the parity-check matrix pass the syndrome-check of the layer basis. However, this method may treat the syndrome-check conservatively. For example, provided that a predesignated maximum number of the decoding iterations is $I_{max}$, even if the decoding of the LDPC code fails up to an $(I_{max}-1)$-th iteration decoding and an $I_{max}$-th iteration decoding is successful, the decoding is determined as failure according to the conservative syndrome-check method. This conservative syndrome-check method may degrade the LDPC coding performance, by offsetting one iteration coding effect.

Thus, the disclosure provides various embodiments for effectively addressing the tradeoff between the syndrome-check efficiency, the syndrome-check result reliability, and the LDPC code performance, in the LDPC code decoding based on the layered scheduling. Specifically, the disclosure provides embodiments for efficiently performing the syndrome-check during or after the decoding of the LDPC code based on the layered scheduling, and aims at outputting the syndrome-check result of high reliability without losing the performance of the LDPC code.

The LDPC code is a linear code, and is defined by a generator matrix and a parity-check matrix. For example, the number of information bits encoded using the LDPC code, that is, a code dimension may be expressed as K, and the number of codeword bits which are the coding result, that is, a code length may be expressed as N. $\mathbb{F}_2$ may be expressed with a binary field, and a codeword bit vector may be expressed as $x \in \mathbb{F}_2^N$. If the parity-check matrix is given as $H \in \mathbb{F}_2^{(N-K) \times N}$, the codeword bit vector may be generated to represent a relation of Equation 1.

$$Hx^T = 0 (0 \in \mathbb{F}_2^{N-K}) \quad \text{Equation 1}$$

For example, if the right codeword bit vector x and the parity-check matrix H are multiplied, every result should be zero. An i-th column of H may be expressed as $h_i$.

By considering that the binary error is added to the codeword bit vector, x+e may be expressed by adding the codeword bit vector x and an error vector $e \in \mathbb{F}_2^N$ where an error location value is 1. If the error is added, Equation 1 may be expressed as Equation 2.

$$H(x+e)^T = Hx^T + He^T = He^T \quad \text{Equation 2}$$

If there is no error, e=0 and the result of Equation 2 is also $He^T=0$. By contrast, with an error, $e \neq 0$ and $He^T \neq 0$ in general. There may be e for $He^T=0$ according to the configuration of the parity-check matrix H, but its corresponding probability may be lowered if the code length is long enough or H is designed appropriately. A typical decoder of the linear code determines whether the codeword includes error based on Equation 2, which may be referred to as the syndrome-check.

The typical decoding process of the LDPC code including the syndrome-check based on Equation 2 is described as below. The decoding of the LDPC code may be understood as message-passing, that is, belief propagation on a bipartite graph corresponding to the parity-check matrix. The number of is in the parity-check matrix is expressed a density, and the density may determine complexity of the encoding and the decoding. The density of the general parity-check matrix of the LDPC code, which is quite lower than the dimension of the whole parity-check matrix, is referred to as the LDPC code.

FIG. 3A illustrates a parity-check matrix for an LDPC code in a wireless communication system according to an embodiment of the disclosure.

Referring to FIG. 3A, a parity-check matrix for a LDPC code in a wireless communication system according to an embodiment of the disclosure is illustrated. FIG. 3A depicts the example of the parity-check matrix $H \in \mathbb{F}_2^{(N-K) \times N}$ of the binary LDPC code with rows of N−K=5 and columns of N=10.

The parity-check matrix of FIG. 3A is exemplary, and its density is relatively high because it is a quite small matrix. The density of a greater parity-check matrix which is used in general may be lower than the example of FIG. 3A.

Figure 3B:
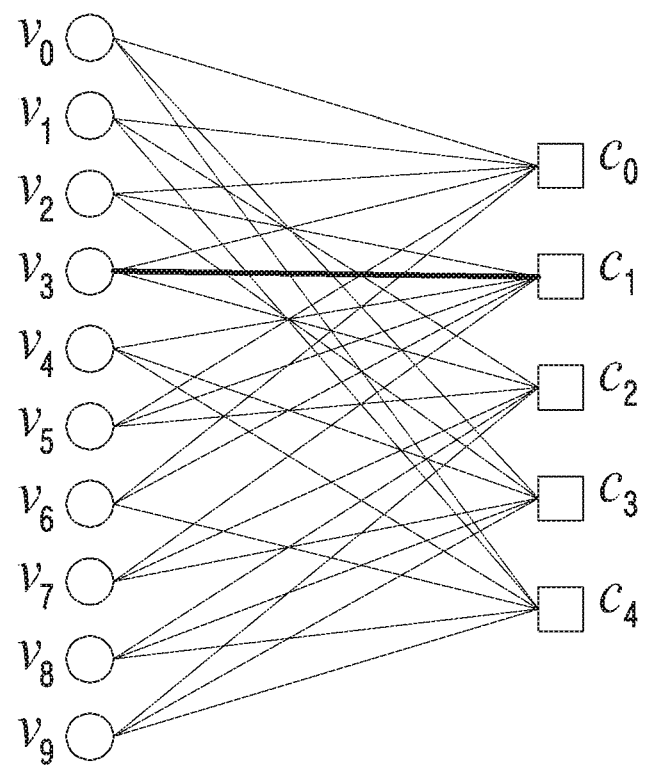
FIG. 3B illustrates a bipartite graph corresponding to the parity-check matrix for an LDPC code in wireless communication system according to an embodiment of the disclosure.

FIG. 3B illustrates a bipartite graph corresponding to parity-check matrix for the LDPC code in the wireless communication system according to an embodiment of the disclosure.

Referring to FIG. 3B, the bipartite graph corresponding to the parity-check matrix of FIG. 3A is illustrated. The bipartite graph includes a VN set, a CN set, and an edge set which connects elements of the two sets. The VN corresponds to each bit of the codeword bit vector $x \in \mathbb{F}_2^N$, and the CN indicates a linear equation expressed by products of each row of the parity-check matrix H and the codeword bit vector x. For example, the i-th CN indicates the linear equation corresponding to $h_i x^T$, to indicate that a result of a modulo-2 sum (XOR) for the bit value of the VN connected to the i-th CN on the graph is zero.

The decoding using the message-passing may be understood as a process where the VN set and the CN set generate and transmit messages using the relationship of the bit value corresponding to the VN and the CN. According to characteristics of the bipartite graph, since the VNs and the CNs are not connected, operations of the VNs may be performed in parallel and operations of the CNs may be performed in parallel as well. Thus, the decoding scheduling which performs the operations of all the VNs all together and performs the operations of all the CNs using an operation result of the VNs may be referred to as flooding.

Figure 4:
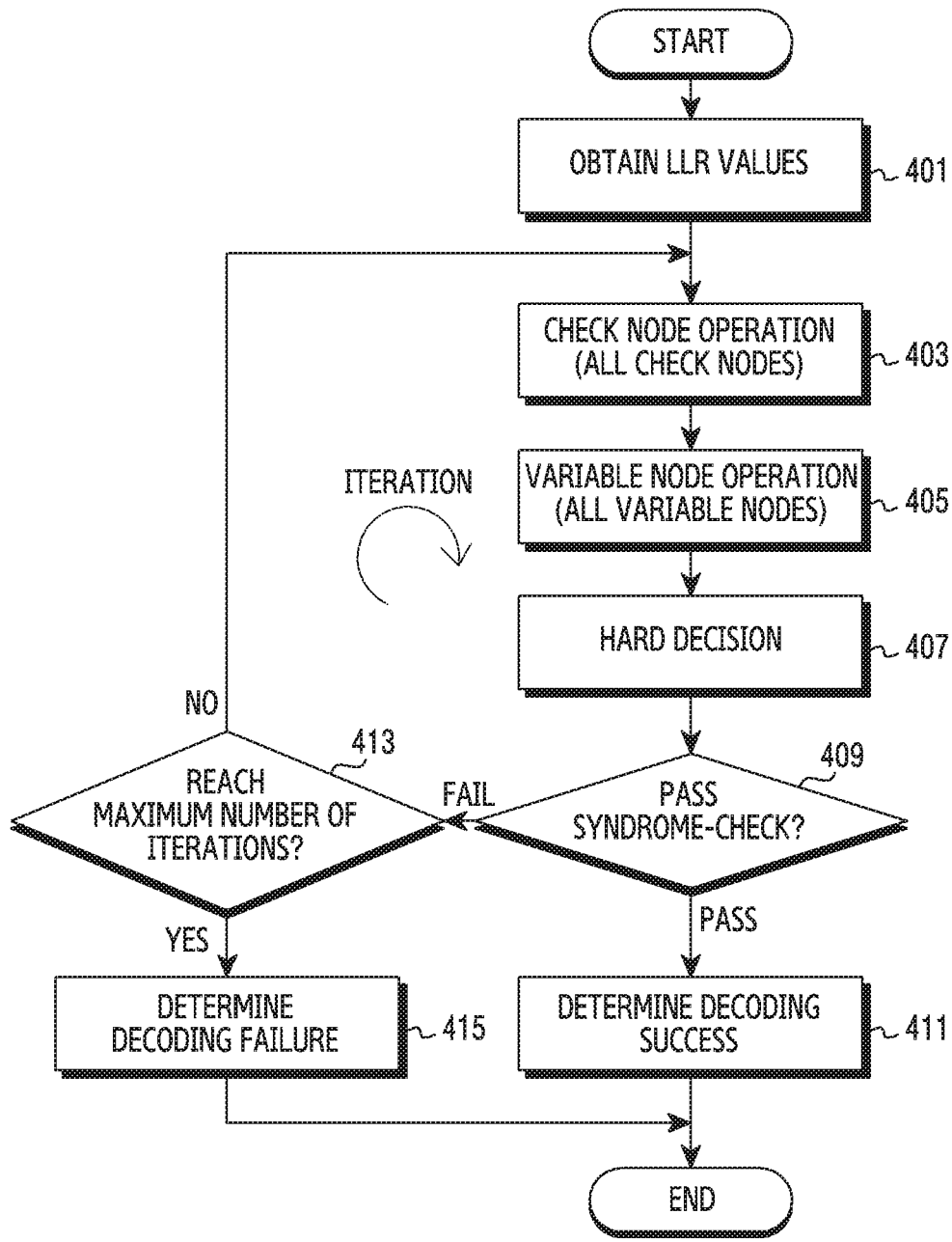
FIG. 4 illustrates a flowchart for flooding-decoding an LDPC code in a wireless communication system according to an embodiment of the disclosure.

FIG. 4 illustrates a flowchart for flooding-decoding an LDPC code in a wireless communication system according to an embodiment of the disclosure. FIG. 4 illustrates an operating method of the device (e.g., the receiver 120).

Referring to FIG. 4, in operation 401, a value which is referred to as a channel LLR or an intrinsic LLR of a corresponding bit, generated from a received signal, is inputted to each VN. The inputted LLR values may be rate de-matched LLR values. In operation 403, the intrinsic LLR of each VN is provided to a neighbor CN, and all the CNs calculate a message corresponding to an extrinsic LLR to send to each VN, based on a received message. In the LDPC code decoder of the flooding scheme, all the CNs calculate and update the message value. The message corresponding to the calculated extrinsic LLR is sent to a neighbor VN along a 0-connected edge. In operation 405, all the VNs generate a message to send to the CNs and a complete LLR for determining a bit value, based on the message corresponding to the received extrinsic LLR and the intrinsic LLR values. The complete LLR may be referred to as a posteriori probability (APP) metric, an APP LLR, or other term having the technically identical meaning In the LDPC code decoder of the flooding scheme, all the VNs calculate and update the message value.

In operation 407, the VN estimates the bit value by hard-deciding the complete LLR, before sending the message to the CN. In operation 409, it is determined whether the estimated bit value satisfies the syndrome-check equation of Equation 2 determined by the parity-check matrix. If the syndrome-check equation is satisfied, the decoding success is determined and the decoding success is outputted and reported in operation 411. If the syndrome-check equation is not satisfied, it is identified whether a current iteration coding count reaches a maximum iteration coding count which is predesignated, in operation 413. If the current iteration coding count does not reach the maximum iteration coding count, the above operations are repeated. If the decoding result does not satisfy the syndrome-check equation of Equation 2 until the current iteration coding count reaches the maximum iteration coding count, the decoding failure is outputted and reported in operation 415.

Now, how each VN and CN calculate the message is described. In operation 403, the CN calculates the message to send back to the neighbor VN using the message received from the neighbor VN. It may be assumed that a set of the CN c and all neighbor VNs is $V_c$, $m_{v \to c}$ is a message sent from the VN v to the CN c, and $m_{c \to v}$ is a message sent from the CN c to the VN v. In this case, a message sent from the CN c to a neighbor VN $v \in V_c$ may be calculated based on Equation 3.

$$m_{c \to v} = 2\tanh^{-1}\left(\prod_{t \in V_c \setminus \{v\}} \tanh\left(\frac{m_{t \to c}}{c}\right)\right) \quad \text{Equation 3}$$

The message generated based on Equation 3 denotes the extrinsic LLR for the bit value of the VN v, calculated by the linear equation of the CN c. It is not easy to implement the CN message equation of Equation 3 with a general processor. Using the equation of Equation 3, the processor needs to calculate $\tanh(\cdot)$ through basic operations, and it is not easy to implement the multiplication compared to the addition. Hence, various methods are used to easily implement Equation 3. Representatively, a method which changes the multiplication to the addition by converting the message into a log domain through log $(\tanh(\cdot))$, and methods which perform each basic operation using a look-up table are used. In addition, a min-sum scheme which approximates Equation 3 based on Equation 4 with some performance damage may be used.

$$m_{c \to v} = \left(\prod_{t \in V_c \setminus \{v\}} \text{sgn}(m_{t \to c})\right) \cdot \min_{t \in V_c \setminus \{v\}} |m_{t \to c}| \quad \text{Equation 4}$$

In operation 405, the VN obtains a sum value of the message received from the neighbor CNs and the intrinsic LLR value, and sends it back to the neighbor VNs. The intrinsic LLR received at the VN v through a channel, a demodulator, and a soft-mapper may be expressed as $L_v$. If the set of the VN v and all the neighbor CNs is $C_v$, a message sent from the VN v to one neighbor CN $c \in C_v$ may be calculated based on Equation 5.

$$m_{v \to c} = L_v + \Sigma_{u \in C_v \setminus \{c\}} m_{u \to v} \quad \text{Equation 5}$$

Based on Equation 5, the VN v sends to the CN c the sum value of the message received from other neighbor CNs than the CN c and the intrinsic LLR value. Since the initial iteration decoding has no message sent from the CN to the VN, the VN adds zero to the intrinsic LLR value. For example, in the initial iteration decoding, the intrinsic LLR value of each VN is sent to the neighbor CNs. In addition, the VN calculates the complete LLR to estimate the bit value. The complete LLR value $\hat{L}_v$ of the VN v may be calculated based on Equation 6.

$$m_{v \to c} = L_v + \Sigma_{u \in C_v} m_{u \to v} \quad \text{Equation 6}$$

Since the VN message generation of Equation 5 and the complete LLR value calculation of Equation 6 are similar, the efficient method for reducing the redundant operations in the decoder implementation may be utilized.

In operation 407, the receiver estimates the bit value corresponding to each VN by performing the hard-decision based on the complete LLR value calculated based on Equation 6. The estimation of the codeword bit vector obtained through the hard-decision may be expressed as $\hat{x}$. According to the syndrome-check equation of Equation 2, the value corresponding to the i-th syndrome $h_i \hat{x}^T$ is identical to the modulo-2 sum (XOR) of the estimated bit values of all the VNs connected to the i-th CN on the graph. Hence, the syndrome-check may be understood as the process in which each VN sends the estimated bit value to the neighbor CN, and each CN identifies whether the modulo-2 sum of all the received estimated bit values is zero. The device determines the decoding success if the syndrome value corresponding to whole or a designated part of the CNs is zero, and early terminates the decoding or outputs and reports the decoding success. The syndrome-check is similar to the CN operation of operation 202 in that the VN sends the message of the estimated bit value to the neighbor CN and the CN performs the operation based on the received value. Hence, the CN operation and the syndrome-check may be implemented together.

In the above syndrome-check, the whole CNs of the parity-check matrix each may perform the syndrome-check, or some CNs may perform the syndrome-check. Particularly, in the LDPC code to which 2-phase decoding of precoder used in advanced television systems committee (ATSC) 3.0 and 3GPP NR, and single parity check (SPC) extension coding, the syndrome-check may be performed only on the CN corresponding to the precoder. In the method which generates the complete codeword by LDPC-encoding information bit and low-density parity check (LDPD)-reencoding the LDPC coding result, the precoder indicates the first LDPC encoding. Hence, the precoder may be referred to as a primary encoder, a first encoder, an LDPC inner encoder, or other term having the technically identical meaning.

Figure 5A:
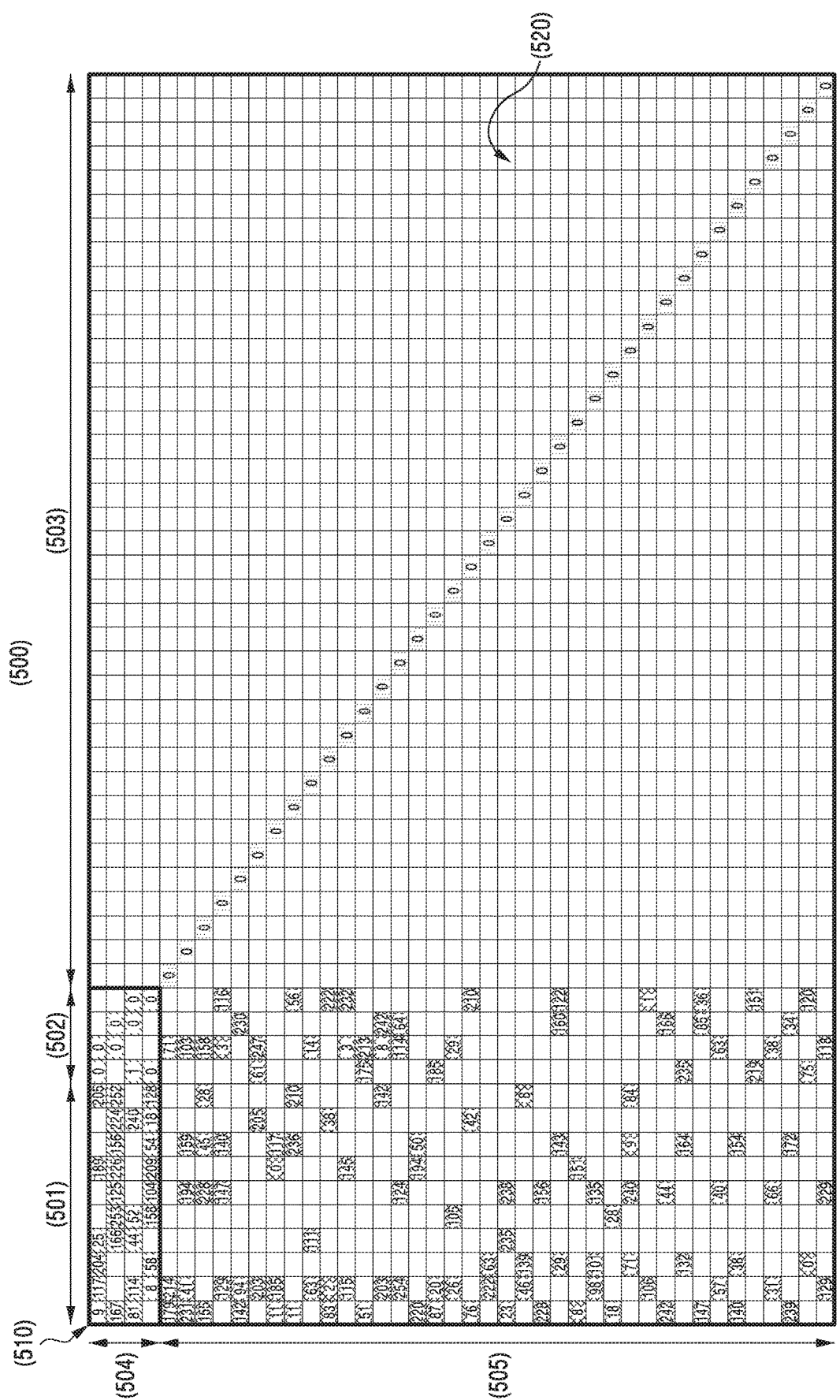
FIG. 5A illustrates a parity-check matrix of an LDPC code in a wireless communication system according to an embodiment of the disclosure.

FIG. 5A illustrates a parity-check matrix of an LDPC code according to an embodiment of the disclosure.

Referring to FIG. 5A, a portion 510 corresponds to the precoder of parity-check matrix 500, and a complete parity-check matrix corresponding to a portion 520 is acquired by setting the precoder as an inner code and conducting the SPC extension which is outer code. According to this relationship, VNs corresponding to columns 501 correspond to information bits which are the coding input and VNs corresponding to columns 502 correspond to parity bits generated by the precoder, in the parity-check matrix of FIG. 5A. VNs corresponding to columns 503 correspond to parity bits generated by the SPC extension coding.

Referring to FIG. 5A, CNs corresponding to rows 504 correspond to CNs of the precoder, and CNs corresponding to rows 505 correspond to CNs of the SPC extension code. The syndrome-check on the LDPC code defined by the parity-check matrix as shown in FIG. 5A may be performed only on the CNs of the parity-check matrix corresponding to the precoder which is the inner code, corresponding to the rows 504.

With respect to the LDPC code of FIG. 5A, the parity-check matrix is performed only on the precoder portion because the weak VNs 503 of degree-1 are connected to the CNs 505 of the SPC extension portion. In general, reliability of the complete LLR operated by the VN is determined by the degree of the corresponding VN, that is, how many VNs the messages are received from. Since information usable by the VN of the degree-1 is only the intrinsic LLR and the message received from one neighbor CN, the calculated complete LLR value generally has low reliability. If the syndrome-check is performed based on the estimated bit value acquired by hard-deciding the complete LLR of the low reliability, the reliability of the corresponding syndrome-check is also lowered. Hence, as shown in FIG. 5A, with respect to the LDPC code configured by concatenation of the precoder and the SPC extension code, the syndrome-check may be conducted only on the CN of the precoder connected only to the VNs of high reliability.

In the decoding of the flooding scheme, all the VNs simultaneously calculate and update the message, and all the CNs simultaneously calculate and update the message in one iteration decoding. In this case, VN operation units as many as the whole VNs and CN operation units as many as the whole CNs are required. Since the number of the operation units increases if the size of the LDPC code is considerable, the layered scheme distinguished from the flooding scheme is used in the general implementation. The LDPC code decoder of the layered scheduling scheme divides the whole parity-check matrix to submatrices of a preset size and sequentially decodes the submatrices. This submatrix is referred to as a layer. For example, in FIG. 5A, each row may be defined as one submatrix.

According to the layered scheme, the decoder may be configured only with the VN operation unit and the CN operation unit corresponding to the submatrix size corresponding to the layer, and accordingly the number of processors and memories of the decoder may reduce. In addition, each VN and each CN do not calculate and update the message once in one iteration decoding, but they calculate and update the message in each decoding of the related layer. In this regard, the layered scheme provides a high convergence speed. By contrast, the flooding scheme processes the operations together, whereas the layered scheme subdivides and sequentially processes the operations with a low decoding speed.

The layered scheduling is appropriate for the decoding of quasi-cyclic (QC)-LDPC code used in various systems, such as institute of electrical and electronical engineers (IEEE) 802.11n/ad, digital video broadcasting (DVB)-T2/C2/S2, ATSC 3.0, and 3GPP NR. The parity-check matrix of the QC-LDPC code is configured using square submatrices of a size Z×Z, and each submatrix includes a circulant-permutation matrix by circularly shifting an identity matrix of the size Z×Z.

Figure 5B:
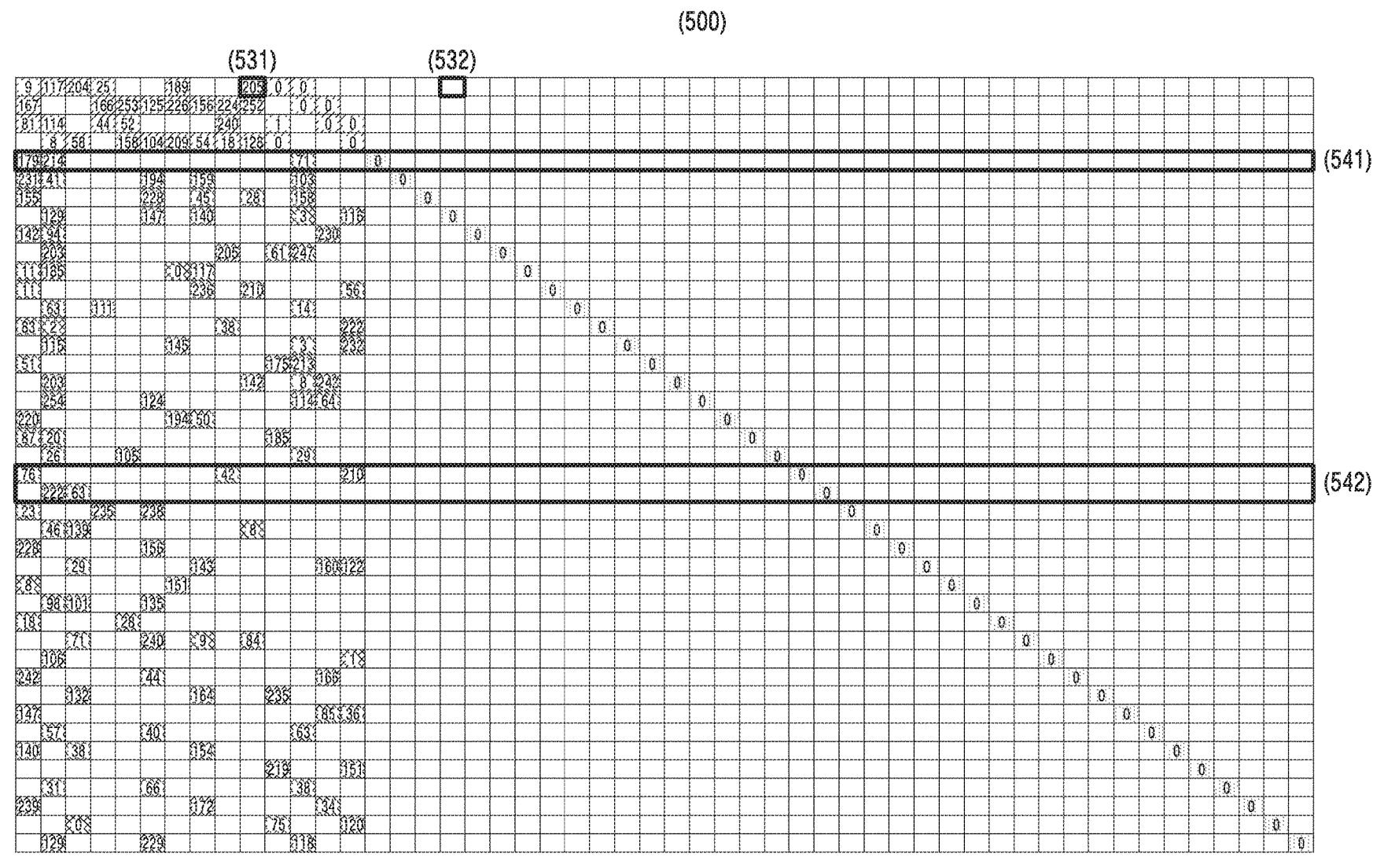

FIG. 5B illustrates a submatrix of a parity-check matrix of an LDPC code in a wireless communication system according to an embodiment of the disclosure.

Referring to FIG. 5B, the parity-check matrix 500 is an example of the QC-LDPC code. Squares (e.g., a square 531) are the Z×Z-sized identity matrix, and indicate the circulant-permutation matrix circularly shifted to right by the recorded number. Herein, the number written in the square may be referred to as an exponent. A matrix with the exponent 0 becomes the Z×Z-sized identity matrix. By contrast, a square (e.g., a square 532) without the exponent indicates a 0 matrix of the size Z×Z. Since VNs and CNs corresponding to the circulant-permutation submatrices respectively are configured independently, the decoding based on the circulant-permutation submatrix may be implemented easily. Hence, in the layered decoding for the QC-LDPC code, one layer is configured with at least one circulant-permutation matrix.

Referring to FIG. 5B, according to the example of the layered coding for the QC-LDPC code, one layer is configured with circulant-permutation matrices in a particular row of the parity-check matrix. Herein, the size of the submatrix of one layer is Z×N (e.g., a row 541) or αZ×N (e.g., rows 542) for a natural number $\alpha \in Z$. In another example of the layered coding for the QC-LDPC code, one layer may be configured with the basic circulant-permutation matrix (e.g., a square 531) of the size Z×Z. In this case, the layered decoder sequentially decodes the circulant-permutation matrices, rather than the zero matrix. Now, operations of the disclosure and its required descriptions are provided based on the method which constructs one layer with all the circulant-permutation matrices of a particular row. However, the disclosure is not limited to the particular layered decoding scheme, and may adopt the layered decoding of any scheme.

Figure 6:
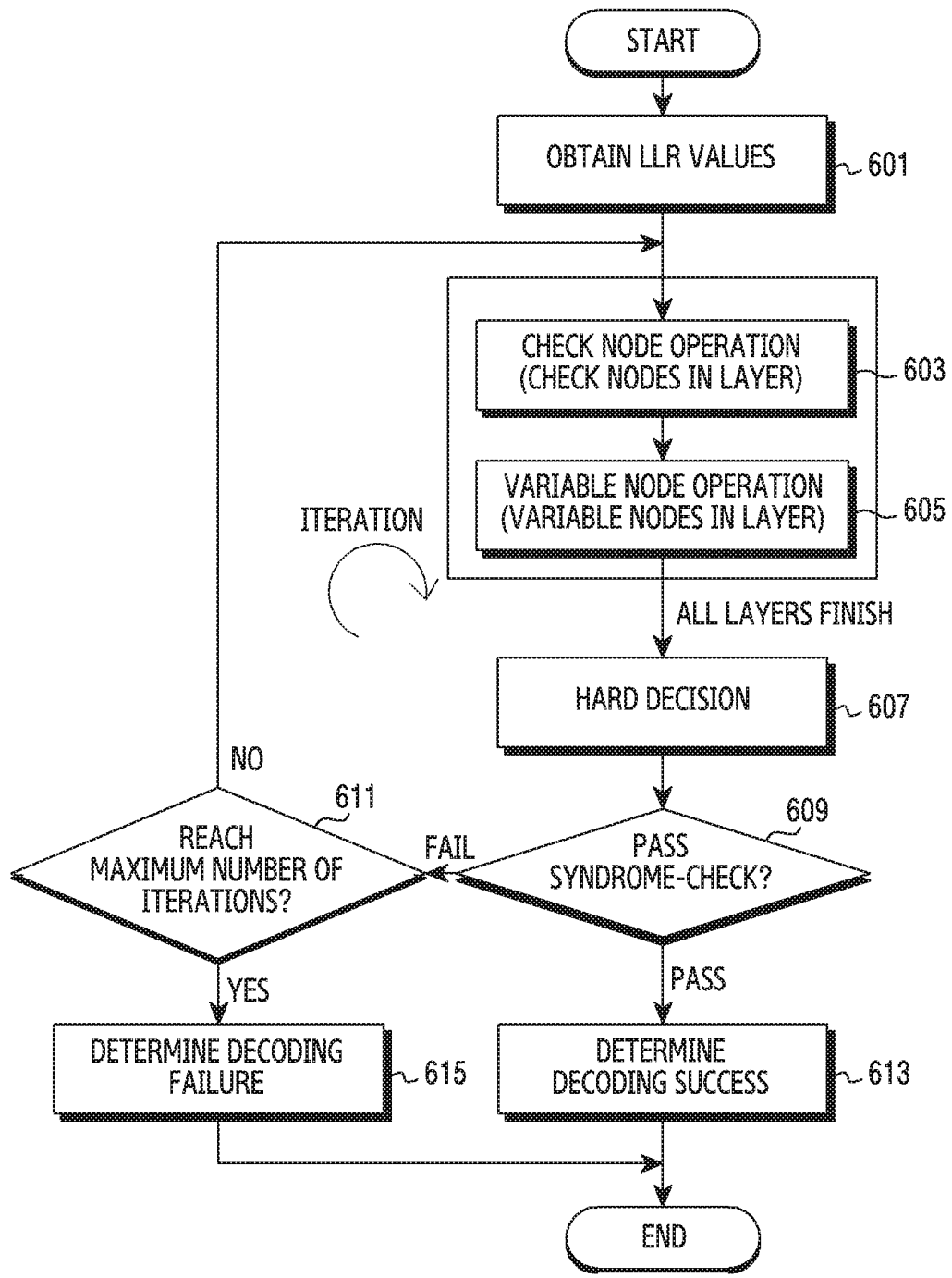
FIG. 6 illustrates a flowchart for layered-decoding an LDPC code in a wireless communication system according to an embodiment of the disclosure.

FIG. 6 illustrates a flowchart for layered-decoding an LDPC code in a wireless communication system according to an embodiment of the disclosure. The difference from the flooding scheme is that the VN operation and the CN operation are sequentially performed on the layer basis in one iteration decoding, as mentioned above. FIG. 6 illustrates an operating method of the device (e.g., the receiver 120).

Referring to FIG. 6, in operation 601, the receiver obtains LLR values and inputs the intrinsic LLR to each VN. In operation 603, the CN of the layer of a next turn receives a message from the connected VN. The CN sends the calculated and updated message to a neighbor VN. In operation 605, the VNs receiving the updated message calculate and update a message to send to the CN and a complete LLR. The aforementioned operations for one layer are referred to as layer processing. If the layer processing is performed on all the layers, the receiver calculates a bit estimation value by hard-deciding the complete LLR calculated at each VN, in operation 607. In operation 609, the receiver identifies whether the decoding is success or failure by performing the syndrome-check on the bit estimation value. In this case, the CN of the parity-check matrix corresponding to the syndrome-check may include all of the CNs or some CNs, such as the CNs of the precoder. If the syndrome-check equation is satisfied, the decoding success is determined and the decoding success is outputted and reported in operation 613. If the syndrome-check equation is not satisfied, it is identified whether a current iteration coding count reaches a maximum iteration coding count which is predesignated, in operation 611. If the current iteration coding count does not reach the maximum iteration coding count, the above operations are repeated. If the decoding result does not satisfy the syndrome-check until the current iteration coding count reaches the maximum iteration coding count, the decoding failure is outputted and reported in operation 615.

In the decoding of the LDPC code of the layered scheme of FIG. 6, the syndrome-check may be added in the CN operation to reduce the increase of the decoding delay. The decoding with the syndrome-check added is shown in FIG. 7.

Figure 7:
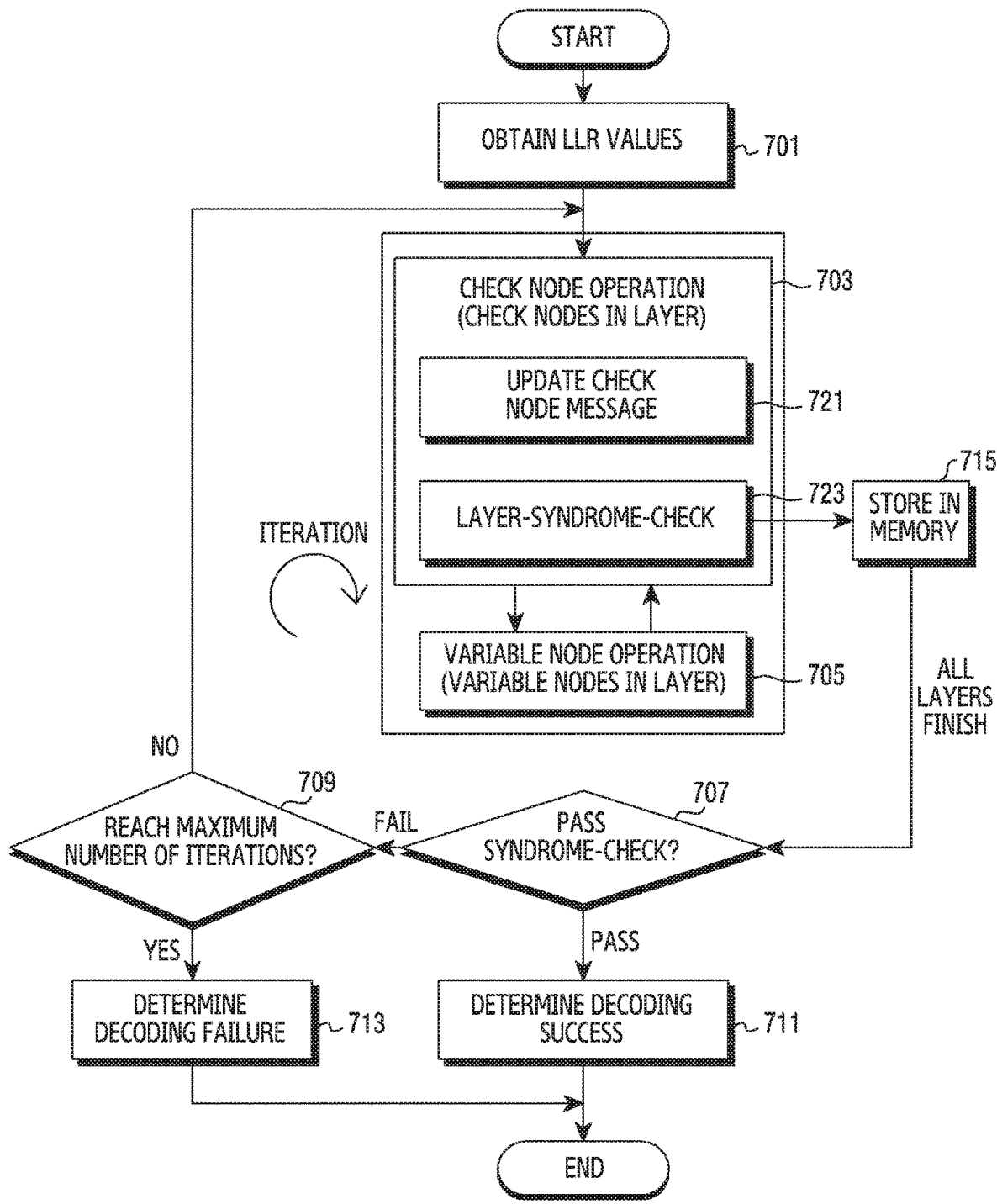
FIG. 7 illustrates a flowchart for layered-decoding an LDPC code including syndrome-check in a wireless communication system according to an embodiment of the disclosure.

FIG. 7 illustrates a flowchart for layered-decoding an LDPC code including syndrome-check in a wireless communication system according to an embodiment of the disclosure.

Referring to FIG. 7, an operating method of a device (e.g., the receiver 120) is illustrated.

As stated above, the CN operation and the syndrome-check have a common feature that each CN receives the message from the neighbor VN and performs the operation and the determination. In operation 701, the device obtains LLR values and inputs the intrinsic LLR to each VN. In operation 703, the CN of the layer of a next turn receives a message from the connected VN. The CN sends the calculated and updated message to a neighbor VN. In the layered decoding, the CN operation 721 for each layer and the syndrome-check 723 corresponding to the layer may be implemented together. In operation 715, the syndrome-check result of each layer is stored in a memory, a buffer, and so on. In operation 705, the VNs receiving the updated message calculate and update a message to send to the CN and a complete LLR. The syndrome-check may be performed on all the CNs of the layer, or only some CNs satisfying the condition of the precoder, as in the decoding of other scheme. If the decoding on all the layers is finished, the decoder identifies whether the decoding is success or failure, using the syndrome-check results stored in the memory or the buffer.

Specifically, in operation 707, the device identifies whether the decoding is success or failure by performing the syndrome-check on the bit estimation value. In this case, the CN of the parity-check matrix corresponding to the syndrome-check may include all of the CNs or some CNs, such as the CNs of the precoder. If the syndrome-check equation is satisfied, the decoding success is determined and the decoding success is outputted and reported in operation 711. If the syndrome-check equation is not satisfied, it is identified whether a current iteration coding count reaches a maximum iteration coding count which is predesignated, in operation 709. If the current iteration coding count does not reach the maximum iteration coding count, the above operations are repeated. If the decoding result does not satisfy the syndrome-check until the current iteration coding count reaches the maximum iteration coding count, the decoding failure is outputted and reported in operation 713.

The decoding of FIG. 7 may reduce the decoding delay and the operations, by implementing the redundant or similar operations together between the CN operation and the syndrome-check. By contrast, the decoding of FIG. 7 does not exhibit high reliability of the obtained syndrome-check result. The layered scheduling sequentially decodes the layers. For example, the LLR values of the VN are updated in real time by each layer processing in one iteration decoding. Hence, the syndrome-check result obtained from the previous layer processing, that is, the layer-based CN operation, VN operation, LLR soft-decision, and syndrome-check may be changed by updating the LLR value of the VN after other layer processing. For example, if the syndrome-check result in the i-th layer of one iteration decoding is stored, the LLR value of the VN related to the i-th layer may be updated in next layer processing. As a result, the syndrome-check result of the i-th layer may substantially change. However, the decoder may not recognize this fact unless it reperforms the syndrome-check on the i-th layer. If the syndrome-check is conducted on the layer basis, it is difficult to implement the system of high reliability because it is hard to trust the syndrome-check result.

To address this problem, the of the decoding result of the LDPC code may be identified by using the syndrome-check result of two consecutive decoding iterations. For example, in the two consecutive decoding iterations, the reliability of the syndrome-check may be improved, by declaring that all or some of the linear constraints of the parity-check matrix pass the syndrome-check of each layer. However, this method may treat the syndrome-check conservatively. For example, provided that a predesignated maximum number of decoding iterations is $I_{max}$, even if the decoding of the LDPC code fails until $I_{max}$-1-th iteration decoding and succeeds at the $I_{max}$-th iteration decoding, the decoding failure is determined according to the above conservative syndrome-check method. Such conservative syndrome-check may degrade the LDPC coding performance, by offsetting one iteration decoding operation effect.

Another example of the stability check may include various methods, such as a method for identifying no change of the estimated bits during the consecutive decoding iterations, and a method for identifying no decrease of an absolute value of the AP-LLR. Accordingly, the disclosure is not limited to the specific stability method.

An embodiment of the disclosure for addressing the above problems is provided now.

In the decoding of the LDPC code including the syndrome-check in each layer processing as shown in FIG. 7, the $I_{max}$-ary decoding iterations are executed, and then additional partial decoding may be performed only on a particular portion of the parity-check matrix predetermined by further considering the structure of the LDPC code. Part of the parity-check matrix on which the additional partial decoding is to be conducted may be determined on various basis, and if the LDPC code is configured through the precoding and the SPC extension as shown in FIG. 5A, a portion corresponding to the precoding may be determined as the target of the additional partial decoding. The additional decoding is identical to the general decoding for the sake of consistent operation, and the additional decoding is performed by limiting only the layer range based on the predetermined portion. In addition, the syndrome-check result on the partial range is outputted and reported.

Figure 8:
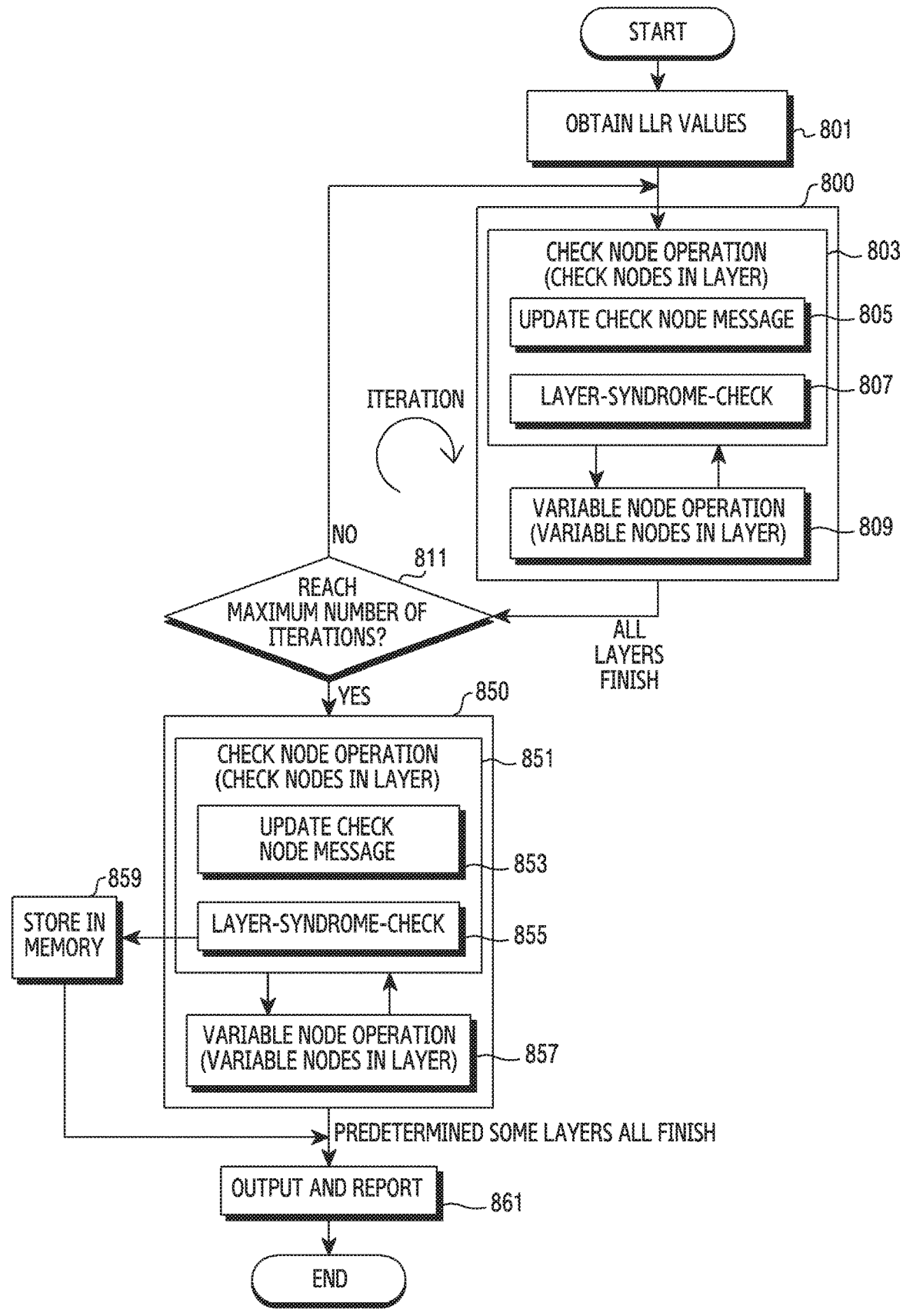
FIG. 8 illustrates a flowchart for performing syndrome-check on a precoding portion through additional iteration decoding after decoding is finished in a wireless communication system according to an embodiment of the disclosure.

FIG. 8 illustrates a flowchart for performing syndrome-check on a precoding portion through additional iteration decoding after decoding in a wireless communication system according to an embodiment of the disclosure. FIG. 8 illustrates an operating method of the device (e.g., the receiver 120).

Referring to FIG. 8, in operation 801, the device obtains LLR values and inputs the intrinsic LLR to each VN. In operation 800, the device performs the layered iteration decoding for the predesignated maximum number of times $I_{max}$ of the iteration decoding. In this case, the CN operation may not conduct the syndrome-check. For example, according to an embodiment of the disclosure, a module for the syndrome-check in decoder circuitry may be disabled during operation 800. For doing so, a control terminal (e.g., a disable terminal) for controlling the syndrome-check module may be included in the decoder circuitry, and a control signal may be applied according to the decoding. However, it the consistent operation is required according to the decoder configuration, the CN operation and the syndrome-check may be conducted together and the syndrome-check result may be ignored according to another embodiment. For example, even if the syndrome-check is performed, the receiver may not conduct the early termination by determining the decoding success or failure based on the corresponding syndrome-check result.

In operation 803, the CN of the layer of a next turn receives a message from the connected VN. The CN sends the calculated and updated message to a neighbor VN. In the layered decoding, the CN operation 805 for each layer and the syndrome-check 807 corresponding to the layer may be implemented together. In operation 809, the VNs receiving the updated message calculate and update a message to send to the CN and a complete LLR.

In operation 811, the device determines whether the decoding iterations reach the maximum number $I_{max}$ of the decoding iterations. If the decoding iterations reach the maximum number of the decoding iterations, the device performs the additional decoding on a predesignated partial parity-check matrix, in operation 850. The device performs the CN operation (e.g., operation 853) and the syndrome-check (e.g., operation 855) in operation 851, and stores the syndrome-check result of each layer in a memory or a buffer in operation 859. In operation 857, the VNs receiving the updated message calculate and update a message to send to the CN and a complete LLR. If the additional decoding on the predetermined portion is finished, the device determines the decoding success or failure based on the syndrome-check result of each layer stored in the buffer. For example, the device identifies the decoding success or failure based on whether all the syndrome-check results are satisfied. If determining the decoding success, the device outputs the decoding results and determines the decoding success in operation 861. If determining the decoding failure, the device outputs necessary results and determines the decoding failure in operation 861.

In the embodiment of FIG. 8, the syndrome-check may not be performed in the layered iteration decoding, and, if performed, its result may be ignored. However, according to an embodiment of the disclosure, if the syndrome-check is performed, its result may be used for the early termination. As mentioned above, the CN operation may not include the syndrome-check, but the syndrome-check may be performed if the consistent operation is required according to the decoder configuration. Hence, if the syndrome-check is conducted, the device may conduct the early termination by using the syndrome-check and the stability check together.

As above, the one embodiment of the disclosure may generate the syndrome-check result with high reliability by further conducting minimum operation. If the decoding time is enough to satisfy a given requirement, the additional partial decoding after $I_{max}$ does not exert great influence on the total time. By contrast, if the decoding time hardly satisfies the given requirement, the requirement may be satisfied by setting the maximum number of the decoding iterations to $I_{max}-1$. In the related art of FIG. 7, the effect of the final iteration decoding vanishes, and the result of the syndrome-check is unclear. By contrast, the method according to the embodiment of the disclosure may achieve the similar performance to the related art of FIG. 7 by reducing the maximum number of the decoding iterations by one, and output the high-reliability syndrome-check result.

According to another embodiment of the disclosure, pseudo syndrome-check may be performed using information additionally outputted from the decoder. In a communication and broadcasting system using multiple input multiple output (MIMO) and non-orthogonal multiple-access (NOMA), the LDPC code decoder and operation blocks including the decoder generate and output a reencoded codeword vector in the decoding success, to perform a subsequent process, such as successive interference cancellation (SIC). In addition, the LDPC code decoder and the operation blocks including the decoder output a complete LLR value, as soft-output, finally updated to improve performance of the system using the MIMO and the NOMA and to detect remaining error. The device performs the pseudo syndrome decoding using the reencoded codeword bit vector and the complete LLR soft-output vector. The embodiment of performing the pseudo syndrome-check may be also applied to the LDPC code decoder of any decoding scheme.

First, if the decoding success is determined through the CRC, the estimated message bit vector may be assumed to be $\hat{m}$. The receiver may reencode the message bit vector $\hat{m}$, and generate and output a codeword bit vector $\hat{x}$. Using Equation 1, the encoding may be performed to achieve a relation of Equation 7.

$$H\hat{x}^T = 0 \qquad \text{Equation 7}$$

If the CRC code is used together and the decoding success is determined through the CRC check, the estimated message bit vector is $\hat{m} \in \mathbb{F}_2^K$. Alternatively, if the CRC code is not used or is not used after the decoding, the estimated message bit vector $\hat{m} \in \mathbb{F}_2^K$ may be acquired by hard-deciding the complete LLR value. For example, if the transmitter does not perform the CRC coding, the estimated message bit vector may be obtained without the CRC check. In addition, even if the CRC coding is performed at the transmitter, the estimated message bit vector may be obtained without the CRC check.

Provided that it is less likely to detect error in the CRC check, $\hat{x}=x$ may be assumed in general. Based on a systematic code, such as LDPC codes of IEEE 802.11n/ad Wi-Fi, DVB-T2/C2/S2, ATSC 3.0, and 3GPP NR used in a real system, the reencoded codeword vector may be expressed as $\tilde{x}=[\tilde{m},\tilde{p}]$, where $\tilde{p} \in \mathbb{F}_2^{N-K}$ denotes the parity-bit vector calculated based on $\tilde{m}$. As stated earlier, if the encoding is performed in the two phases of the precoder and the SPC extension, $\tilde{x}=[\tilde{m},\tilde{p}_1,\tilde{p}_2]$, where $\tilde{p}_1,\tilde{p}_2$ denote the parity-bit vector generated using the precoder and the SPC extension respectively. If the parity-check matrix corresponding to the precoder as shown in the portion 510 of FIG. 5A is set to $H_p$, part $[\tilde{m},\tilde{p}_1]$ of the reencoded codeword bit vector may be expressed to satisfy Equation 8.

$$H_p[\tilde{m},\tilde{p}_1]^T=0 \qquad \text{Equation 8}$$

If the soft-output LLR vector of the length N is expressed as $L=(l_0,l_1,\ldots,l_{N-1}) \in \mathbb{R}^N$, the LLR value $l_i$ for the i-th codeword bit where the receive signal vector for each bit is $y \in \mathbb{R}^N$ may be expressed as a likelihood ratio as shown in Equation 9.

$$l_i = \log\frac{p(y \mid x_i = 0)}{p(y \mid x_i = 1)} \qquad \text{Equation 9}$$

Based on Equation 9, the estimated bit value $\hat{x}_i$ acquired by hard-deciding the i-th codeword bit $x_i$ may be expressed using Equation 10.

$$\hat{x}_i = \begin{cases} 0 & \text{for } l_i \geq 0 \\ 1 & \text{for } l_i < 0 \end{cases} \qquad \text{Equation 10}$$

If the estimated codeword bit vector obtained based on Equation 10 is $\hat{x} \in \mathbb{R}^N$, the estimated codeword bit vector $\hat{x}$ may be expressed as $\hat{x}=[\hat{m},\hat{p}]$ or $\hat{x}=[\hat{m},\hat{p}_1,\hat{p}_2]$ by separating the message bit vector and the parity bit vector, as in the reencoded codeword bit vector $\tilde{x}$. The syndrome-check to be performed at the decoder is identifying whether 0 vector is calculated based on Equation 11 or Equation 12.

$$H\hat{x}^T=H(x+e)^T=Hx^T+He^T=He^T \qquad \text{Equation 11}$$

$$H_p[\hat{m},\hat{p}_1]=H_p[m+e_m,p_1+e_{p1}]=H_p[m,p_1]+H_p[e_m,e_{p1}]=H_p[e_m,e_{p1}] \qquad \text{Equation 12}$$

If the output of the decoder is determined, the decoding is completed and belated syndrome-check may increase computational complexity. Hence, the pseudo syndrome-check may be performed using the estimated codeword bit vector $\hat{x}$ and the reencoded codeword bit vector $\tilde{x}$. If the syndrome-check is performed on all the CNs of the parity-check matrix, Equation 6 and Equation 11 may be compared based on Equation 13.

$$H\hat{x}^T=H\tilde{x}^T=0$$

$$H^{-1}H\hat{x}^T=H^{-1}H\tilde{x}^T$$

$$\hat{x}^T=\text{now } \tilde{x}^T \qquad \text{Equation 13}$$

Assuming that the syndrome-check is successful based on Equation 13, the estimated codeword bit vector $\hat{x}$ and the reencoded codeword bit vector $\tilde{x}$ should be identical. Hence, if the two vectors are compared, the same decision as the intended syndrome-check is expected. The message bit portions $\hat{m}$ and $\tilde{m}$ of the estimated codeword bit vector $\hat{x}$ and the reencoded codeword bit vector $\tilde{x}$ based on Equation 13 are acquired equally through the hard-decision of the complete LLR and thus may be excluded from the comparison.

For example, if the estimated codeword bit vector $\hat{x}$ and the reencoded codeword bit vector $\tilde{x}$ are identical, the same decision as the syndrome-check may be expected. If the syndrome-check is conducted only on the CN corresponding to the precoding in the two-phase parity-check matrix, Equation 8 and Equation 12 may be compared based on Equation 14.

$$H_p[\tilde{m},\tilde{p}_1]^T=H_p[\hat{m},\hat{p}_1]=0$$

$$H_p^{-1}H_p[\tilde{m},\tilde{p}_1]^T=H_p^{-1}H_p[\hat{m},\hat{p}_1]^T$$

$$[\tilde{m},\tilde{p}_1]^T=[\hat{m},\hat{p}_1]^T \qquad \text{Equation 14}$$

For example, if $[\hat{m},\hat{p}_1]$ which is part of the estimated codeword bit vector and $[\tilde{m},\tilde{p}_1]$ which is part of the reencoded codeword bit vector are identical, the same decision as the syndrome-check may be expected. As mentioned above, the receiver performs the pseudo syndrome-check using the reencoded codeword bit vector and the complete LLR soft-output value.

Provided that the syndrome-check is successful based on Equation 14, $[\hat{m},\hat{p}_1]$ which is part of the estimated codeword bit vector and $[\tilde{m},\tilde{p}_1]$ which is part of the reencoded codeword bit vector should be identical. Hence, if the two vectors are compared, the same decision as the intended syndrome-check is expected. The message bit portions $\hat{m}$ and $\tilde{m}$ of the estimated codeword bit vector $\hat{x}$ and the reencoded codeword bit vector $\tilde{x}$ in Equation 14 are acquired equally through the hard-decision of the complete LLR and thus may be excluded from the comparison.

As stated above, if it is impossible to perform the high-reliability syndrome-check inside the decoder, the device may perform the pseudo syndrome-check by using the reencoded codeword bit vector and the complete LLR soft-output value outside the decoder. A functional configuration for the pseudo syndrome-check is described by referring to FIG. 9.

Figure 9:
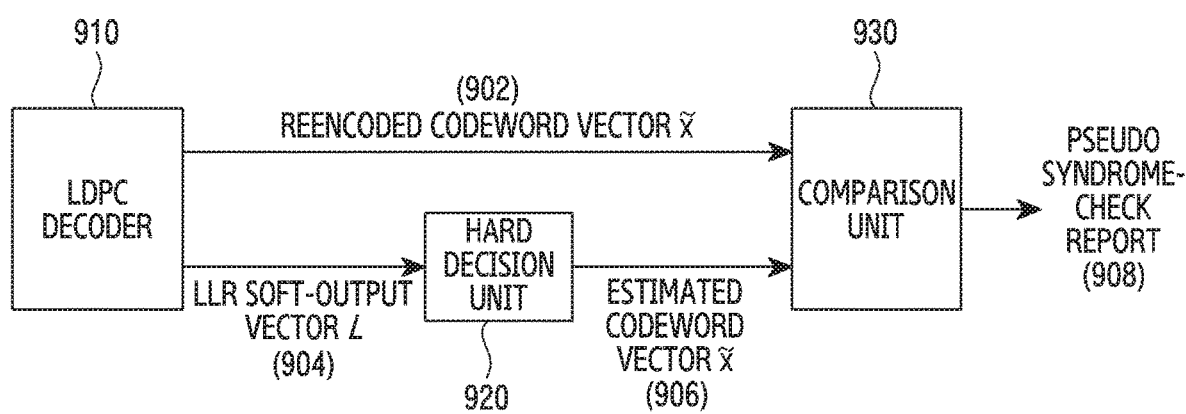
FIG. 9 illustrates a functional configuration for pseudo syndrome-check in a wireless communication system according to an embodiment of the disclosure.

FIG. 9 illustrates a functional configuration for pseudo syndrome-check in a wireless communication system according to an embodiment of the disclosure. The functional configuration of FIG. 9 may be understood as part of the configuration of the device (e.g., the receiver 120).

Referring to FIG. 9, the device includes an LDPC decoder 910, a hard decision unit 920, and a comparison unit 930. The LDPC decoder 910 performs decoding in a preset manner and outputs its result. The outputted decoding result includes a reencoded codeword vector 902 and a decoding LLR soft-output vector 904 using the decoding result message bit vector. The decoding LLR soft-output vector 904 is inputted to the hard decision unit 920, and the hard decision unit 920 outputs an estimated codeword bit vector 906. The reencoded codeword vector 902 and the estimated codeword bit vector 906 are inputted to the comparison unit 930. The comparison unit 930 compares whole or part of the reencoded codeword vector 902 and the estimated codeword bit vector 906, and outputs a comparison result as a pseudo syndrome-check result 908. To determine the comparison part of the two bit vectors, the characteristics of the parity-check matrix of the LDPC code may be considered. For example, only the codeword portion generated by the precoding may be compared, or only the parity portion generated by the precoding may be compared.

As stated earlier, according to an embodiment of the disclosure, in the decoding of the layered scheduling of the LDPC code including the syndrome-check in each layer processing, the syndrome-check result is outputted by conducting the iteration decoding $I_{max}$ times, and then performing the additional partial decoding only on a particular portion of the parity-check matrix which is predetermined by further considering the structure of the LDPC code. The LDPC code used in 3GPP 5G NR and ATSC 3.0 is encoded through two phases of the precoder and the SPC extension, which is reflected in the parity-check matrix. In an embodiment of the disclosure, in the decoding of the layered scheduling, if the $I_{max}$-ary iteration decoding is completed, the additional partial decoding is conducted only on a portion corresponding to the precoder. The additional partial decoding is identical to the general decoding for the sake of the consistent operation, by limiting only the range of the layer for the decoding. The syndrome-check result on this partial range is outputted and reported.

In the decoding of the LDPC code, another embodiment of the disclosure performs the pseudo syndrome-check by utilizing a reencoded codeword sequence obtained after the decoding and a complete updated LLR sequence which is called the soft-output. An LDPC code decoder of a communication and broadcasting system using MIMO and NOMA, or operation blocks including the same generate and output the reencoded codeword sequence in response to the decoding success to perform a subsequent process, such as SIC. In addition, the LDPC code decoder and the operation blocks including the same output a complete LLR value, as the soft-output, finally updated for the sake of performance improvement of the system using the MIMO and the NOMA and the remaining error detection. The device may perform the pseudo syndrome-check which is substantially similar to the syndrome-check of the decoder of the LDPC code using the outputted information.

The two embodiments as mentioned above, that is, the embodiment for adding the partial decoding in FIG. 8 and the embodiment for performing the pseudo syndrome-check in FIG. 9 may be realized together. For example, the decoding success or failure may be determined more accurately, by performing both of the syndrome-check based on the partial decoding result and the pseudo syndrome-check based on the reencoding after the decoding.

An apparatus and a method according to various embodiments of the disclosure may efficiently decoding the LDPC code using the layered scheduling and concurrently acquire the syndrome-check result of high reliability. Specifically, the apparatus and the method according to various embodiments of the disclosure may improve reliability of the system and error detection performance, by outputting the syndrome-check result of the high reliability in the layered scheduling.

In addition, the apparatus and the method according to various embodiments of the disclosure may prevent performance degradation of the LDPC code, by outputting the consistent syndrome-check result.

The methods according to the embodiments described in the claims or the specification of the disclosure may be implemented in hardware, software, or a combination of hardware and software.

For the software implementation, a computer-readable storage medium which stores one or more programs (software modules) may be provided. One or more programs stored in the computer-readable storage medium may be configured for execution by one or more processors of an electronic device. One or more programs may include instructions for enabling the electronic device to execute the methods according to the embodiments described in the claims or the specification of the disclosure.

Such a program (software module, software) may be stored to a random access memory, a non-volatile memory including a flash memory, a ROM, an EEPROM, a magnetic disc storage device, a compact disc (CD)-ROM, digital versatile discs (DVDs) or other optical storage devices, and a magnetic cassette. Alternatively, the programs may be stored to a memory combining part or all of them. In addition, a plurality of memories may be included.

In addition, the programs may be stored in an attachable storage device accessible via a communication network, such as Internet, Intranet, LAN, wide LAN (WLAN), or storage area network (SAN), or a communication network by combining these networks. Such a storage device may access an apparatus which realizes an embodiment of the disclosure through an external port. In addition, a separate storage device on the communication network may access the apparatus which realizes an embodiment of the disclosure.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method for decoding a low-density parity-check (LDPC) code in a wireless communication system, the method comprising:
   receiving a codeword comprising an inner code and an outer code;
   performing decoding iterations on the codeword, for a predefined maximum number of times using a parity check matrix;
   after performing the decoding iterations on the codeword, for the predefined maximum number of times using the parity check matrix, performing an additional decoding that is a partial decoding using a partial area of the parity check matrix; and
   determining decoding success or failure of the codeword based on a result of the partial decoding,
   wherein the partial area comprises an area associated with the inner code.

2. The method of claim 1, wherein another area than the partial area in the parity check matrix comprises a parity portion of a degree 1.

3. The method of claim 1, wherein the performing of the decoding iterations comprises:
   sequentially decoding submatrices of the parity check matrix.

4. The method of claim 1, wherein the result of the partial decoding comprises a syndrome-check result of check nodes corresponding to the partial area.

5. The method of claim 1, further comprising:
   terminating the decoding, when two decoding iterations, before the decoding iterations of the maximum number of times, consecutively pass syndrome-check in two decoding iterations.

6. A method for decoding a low-density parity-check (LDPC) code in a wireless communication system, the method comprising:
   receiving a codeword;
   decoding the codeword using a parity check matrix;
   generating a first codeword by re-encoding values corresponding to a message bit vector among values acquired through the decoding;
   generating a second codeword by hard-deciding the values acquired through the decoding; and
   determining decoding success or failure of the codeword based on a comparison result of the first codeword and the second codeword.

7. The method of claim 6, wherein the determining of the decoding success or failure of the codeword comprises:
   comparing parity bits of the first codeword and parity bits of the second codeword.

8. The method of claim 6, wherein the determining of the decoding success or failure of the codeword comprises:
   in response to identifying the first codeword and the second codeword are identical, determining the decoding success; and
   in response to identifying the first codeword and the second codeword are different, determining the decoding failure.

9. The method of claim 6, wherein the values acquired through the decoding comprise log likelihood ratio (LLR) values.

10. An apparatus for using a low-density parity-check (LDPC) code in a wireless communication system, the apparatus comprising:
    a transceiver; and
    at least one processor operably coupled to the transceiver, and configured to:
      receive a codeword comprising an inner code and an outer code,
      perform decoding iterations on the codeword, for a predefined maximum number of times using a parity check matrix,
      after performing the decoding iterations on the codeword, for the predefined maximum number of times using the parity check matrix, perform an additional decoding that is a partial decoding using a partial area of the parity check matrix, and
      determine decoding success or failure of the codeword based on a result of the partial decoding,
    wherein the partial area comprises an area associated with the inner code.

11. The apparatus of claim 10, wherein other area than the partial area in the parity check matrix comprises a parity portion of a degree 1.

12. The apparatus of claim 10, wherein the at least one processor is further configured to sequentially decode sub-matrices of the parity check matrix.

13. The apparatus of claim 10, wherein the result of the partial decoding comprises a syndrome-check result of check nodes corresponding to the partial area.

14. The apparatus of claim 10, wherein the at least one processor is further configured to terminate the decoding, when two decoding iterations, before the decoding iterations of the maximum number of times, consecutively pass syndrome-check in two decoding iterations.

* * * * *